US009588877B1

(12) United States Patent
Adir et al.

(10) Patent No.: US 9,588,877 B1
(45) Date of Patent: *Mar. 7, 2017

(54) UNIT-LEVEL FORMAL VERIFICATION FOR VEHICULAR SOFTWARE SYSTEMS

(71) Applicant: International Business Machines Corporation, Armonk, NY (US)

(72) Inventors: Allon Adir, Kiryat Tivon (IL); Fady Copty, Nazareth (IL); Dmitry Pidan, Netanya (IL); Tamer Salman, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/064,055

(22) Filed: Mar. 8, 2016

Related U.S. Application Data

(63) Continuation of application No. 14/865,101, filed on Sep. 25, 2015.

(51) Int. Cl.
*G06F 9/44* (2006.01)
*G06F 11/36* (2006.01)

(52) U.S. Cl.
CPC ...... *G06F 11/3684* (2013.01); *G06F 11/3608* (2013.01); *G06F 11/3692* (2013.01)

(58) Field of Classification Search
CPC ............. G06F 11/3608; G06F 11/3684; G06F 11/3692
USPC ................................................ 717/124–135
See application file for complete search history.

(56) References Cited

U.S. PATENT DOCUMENTS

| 8,448,130 | B1 | 5/2013 | Pillarisetti et al. |
| 8,464,204 | B1 | 6/2013 | Thornton et al. |
| 8,577,654 | B2 | 11/2013 | Moore |
| 8,615,385 | B1 | 12/2013 | Aldrich |
| 2012/0167045 | A1 | 6/2012 | Jeon et al. |
| 2012/0254827 | A1* | 10/2012 | Conrad ..................... G06F 8/35 717/104 |

(Continued)

FOREIGN PATENT DOCUMENTS

| EP | 2469416 A1 | 6/2012 |
| WO | 2015035438 A1 | 3/2015 |

OTHER PUBLICATIONS

Adir et al., "Using a High-Level Test Generation Expert System for Testing In-Car Networks," Jun. 2014, ACM.*

(Continued)

*Primary Examiner* — Qing Chen
(74) *Attorney, Agent, or Firm* — Robert C. Bunker

(57) ABSTRACT

According to one exemplary embodiment, a method for preparing a software component for verification is provided. The method may include receiving the software component and a design model. The method may also include generating a wrapper program based on the received software component and the received design model. The method may then include associating the received software component with the generated wrapper program. The method may further include determining a plurality of inputs for the received software component based on the received design model. The method may also include sending the determined plurality of inputs and the received software component with associated wrapper program to a verification tool.

1 Claim, 6 Drawing Sheets

(56) References Cited

U.S. PATENT DOCUMENTS

| | | | | |
|---|---|---|---|---|
| 2012/0254830 | A1* | 10/2012 | Conrad | G06F 8/35 717/106 |
| 2014/0380269 | A1* | 12/2014 | Conrad | G06F 11/3604 717/104 |
| 2015/0067148 | A1* | 3/2015 | Kim | H04L 67/12 709/224 |

OTHER PUBLICATIONS

Krause et al., "Verification of AUTOSAR Software by SYSTEMC-Based Virtual Prototyping," 2009, Springer Science + Business Media B.V., p. 261-293.*

Lee et al., "ECU Configuration Framework based on AUTOSAR ECU Configuration Metamodel," Aug. 2009, ACM, p. 260-263.*

Park et al., "Test methods of the AUTOSAR application software components," Aug. 2009, ICROS-SICE International Joint Conference 2009, p. 2601-2606.*

Sandmann et al., "AUTOSAR-Compliant Development Workflows: From Architecture to Implementation—Tool Interoperability for Round-Trip Engineering and Verification & Validation," Apr. 2012, SAE 2012 World Congress & Exhibition, p. 1-8.*

AUTOSAR, "Welcome to the AUTOSAR development partnership," AUTOSAR Home, 2014, p. 1, AUTomotive Open System ARchitecture, http://www.autosar.org/, Accessed on May 18, 2015.

Choosang et al., "A Formal Model of an AUTOSAR In-Vehicle Communications Protocol," International Conference on Information and Communication Technology for Embedded Systems (ICICTES 2010), Jan. 28-30, 2010, 12 Pages, Session 3A, Pathumthani, Thailand.

Enoiu et al., "ViTAL : A Verification Tool for EAST-ADL Models using UPPAAL PORT," IEEE 17th International Conference on Engineering of Complex Computer Systems, 2012, p. 328-337, IEEE Computer Society.

Fang et al., "Formal Model-Based Test for AUTOSAR multicore RTOS," IEEE Fifth International Conference on Software Testing, Verification and Validation, 2012, p. 251-259, IEEE Computer Society.

He et al., "A Survey of Study of FlexRay Systems for Automotive Net," International Conference on Electronic & Mechanical Engineering and Information Technology, Aug. 12-14, 2011, p. 1197-1204, IEEE.

Heinecke et al., "Software Components for Reliable Automotive Systems," DATE08, 2008, p. 549-554, EDAA.

Mell et al., "The NIST Definition of Cloud Computing," National Institute of Standards and Technology, Sep. 2011, p. 1-3, Special Publication 800-145.

Popovic et al., "Formal Verification of Embedded Software Based on Software Compliance Properties and Explicit Use of Time," International Journal of Computers, 2011, p. 423-430, Issue 3, vol. 5, University of Novi Sad.

Sangiovanni-Vincentelli et al., "Embedded System Design for Automotive Applications," Computer, Oct. 2007, p. 42-51, Issue 10, vol. 40, IEEE Computer Society.

IBM, "List of IBM Patents or Patent Applications Treated as Related (Appendix P)," Sep. 27, 2016, p. 1-2.

Adir et al., "Unit-Level Formal Verification for Vehicular Software Systems," Application and Drawings, filed on Sep. 25, 2015, 32 Pages, U.S. Appl. No. 14/865,101.

* cited by examiner

UNIT-LEVEL FORMAL VERIFICATION FOR VEHICULAR SOFTWARE SYSTEMS

BACKGROUND

The present invention relates generally to the field of computing, and more particularly to verifying vehicular software components.

The automotive open system architecture (AUTOSAR) standard allows the definition of a model independently of the hardware in the vehicle. The application includes a collection of "software components." Each software component describes some feature in the vehicle and includes a number of "runnable entities" that may be C functions. The model of the application and of the software components define how the runnable entities should be executed and the dependencies between them.

SUMMARY

According to one exemplary embodiment, a method for preparing a software component for verification is provided. The method may include receiving the software component and a design model. The method may also include generating a wrapper program based on the received software component and the received design model. The method may then include associating the received software component with the generated wrapper program. The method may further include determining a plurality of inputs for the received software component based on the received design model. The method may also include sending the determined plurality of inputs and the received software component with associated wrapper program to a verification tool.

According to another exemplary embodiment, a computer system for preparing a software component for verification is provided. The computer system may include one or more processors, one or more computer-readable memories, one or more computer-readable tangible storage devices, and program instructions stored on at least one of the one or more storage devices for execution by at least one of the one or more processors via at least one of the one or more memories, whereby the computer system is capable of performing a method. The method may include receiving the software component and a design model. The method may also include generating a wrapper program based on the received software component and the received design model. The method may then include associating the received software component with the generated wrapper program. The method may further include determining a plurality of inputs for the received software component based on the received design model. The method may also include sending the determined plurality of inputs and the received software component with associated wrapper program to a verification tool.

According to yet another exemplary embodiment, a computer program product for preparing a software component for verification is provided. The computer program product may include one or more computer-readable storage devices and program instructions stored on at least one of the one or more tangible storage devices, the program instructions executable by a processor. The computer program product may include program instructions to receive the software component and a design model. The computer program product may also include program instructions to generate a wrapper program based on the received software component and the received design model. The computer program product may then include program instructions to associate the received software component with the generated wrapper program. The computer program product may further include program instructions to determine a plurality of inputs for the received software component based on the received design model. The computer program product may also include program instructions to send the determined plurality of inputs and the received software component with associated wrapper program to a verification tool.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

DETAILED DESCRIPTION

Figure 1:
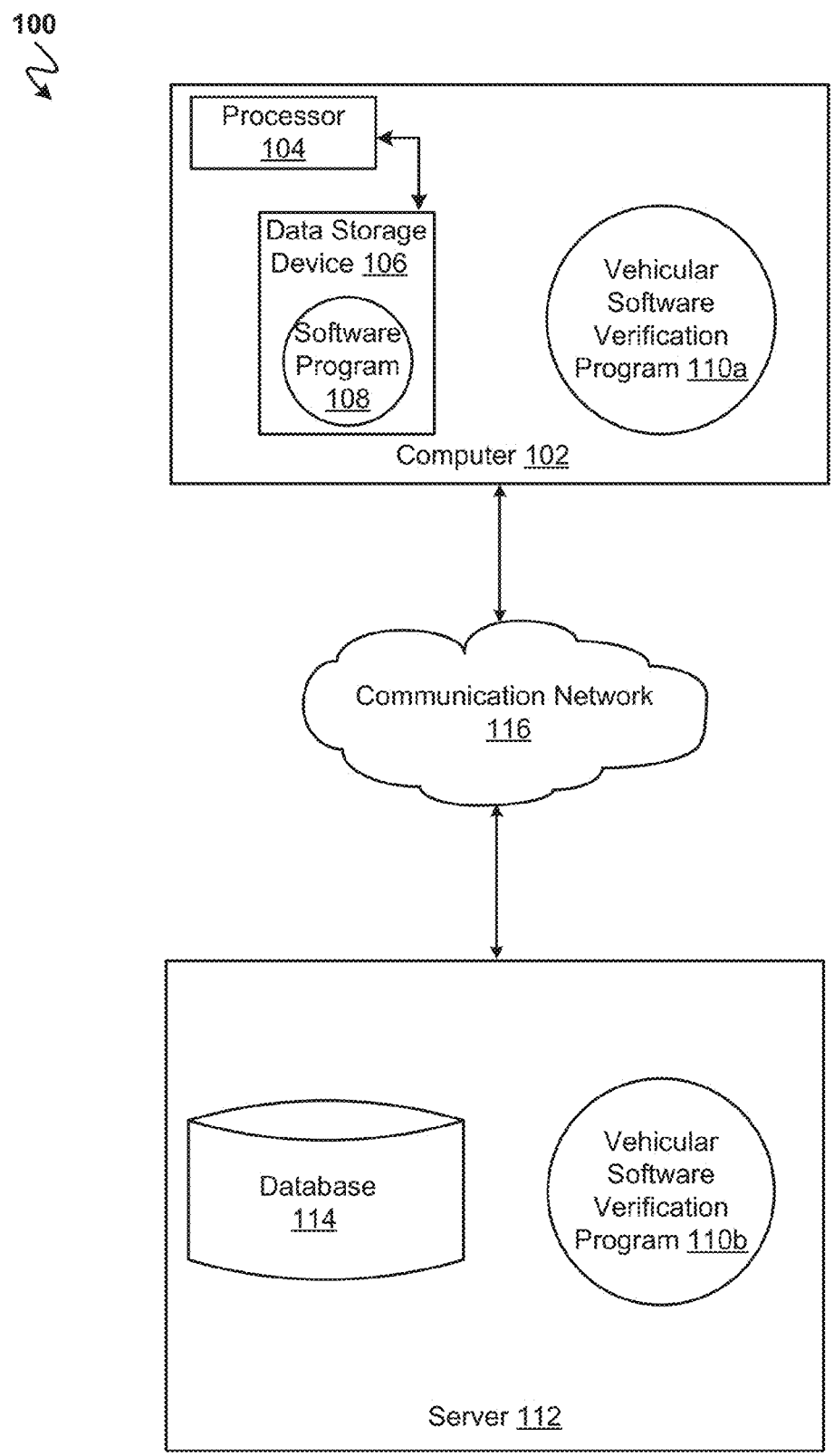
FIG. 1 illustrates a networked computer environment according to at least one embodiment.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The following described exemplary embodiments provide a system, method and program product for unit-level formal verification for vehicular software systems. As such, the present embodiment has the capacity to improve the technical field of vehicular software systems by providing a way to automatically generate a formal environment that allows for a formal verification tool to be applied on software components. More specifically, a software component or runnable entity (i.e., the verification target), a design model, and business logic rules may be received as input. A wrapper program may be generated (i.e., the automatically generated formal verification environment) for the received runnable entity and the wrapper program may be used to feed inputs into the runnable entity. Next, possible input values for the wrapped runnable entity may be determined by using the received design model. Possible input value may be refined using the received business logic rules. Thereafter, the refined inputs along with the wrapper program and runnable entity may be inputted into a formal verification tool, whereby the formal verification tool may verify the runnable entity using the wrapper program and refined inputs.

As described previously, the AUTOSAR standard allows the definition of a model independently of the hardware in the vehicle. The application includes a collection of "software components." Each software component describes some feature in the vehicle and includes a number of "runnable entities" that may be C functions. The model of the application and of the software components define how the runnable entities should be executed and the dependencies between them. AUTOSAR applications run on top of a standard runtime environment (RTE). The RTE provides the standard hardware-independent AUTOSAR environments, such as the processors (engine control units (ECUs)) that may be part of the vehicle computer network. The AUTOSAR software model may utilize many small pieces of code (i.e., runnable entities) together with detailed static (i.e., non-code) model information about how these pieces of code should be run and interact with each other.

AUTOSAR models may also be simulated on a computer (e.g., personal computer) before being embedded in a vehicle's ECU. In such instances, industrial tools may generate a RTE that allows the execution of the application on a computer.

Testing software for use in vehicular software systems (e.g., in AUTOSAR environments) or simulations may not cover all possible scenarios and some hard-to-read corner-case bugs may not be discovered due to the complexity of the scenarios required for their discovery. AUTOSAR software applications have a unique form and thus traditional software formal verification tools may not be effective in handling AUTOSAR software applications. Many vehicular software systems are associated with safety critical systems. An error in the production of software may cause the loss of human life. Less critical errors may still have large negative financial implications for automotive manufacturers.

Therefore, it may be advantageous to, among other things, provide a way for software verification in vehicular software systems that automatically generates a formal environment that allows a generic formal verification tool to be applied on software components designed for vehicular software systems.

According to at least one embodiment, automatically generated formal environments based on the AUTOSAR model may be used to perform formal verification of a software component or one of its runnable entities prior being embedded in automotive ECUs. The present embodiment may use the AUTOSAR design model and business logic rules containing information regarding the inputs received by the software components from the RTE, in addition to the software component or the runnable entity being tested.

Additionally, the present embodiment, may provide an automatic method enabling proofs to the fact that the software component targeted for verification satisfies some specified requirements. Furthermore, formal verification may discover hard-to-reach corner-case bugs that may be missed using traditional techniques (e.g., user-created tests and simulations) due to the complexity of the scenarios required for their discovery. User-created tests and simulations are likely to miss all possible requirements and exercise all possible scenarios that check those requirements.

The present embodiment concerns formal verification of the software components against given assertions that ensure the satisfaction of properties using a generic software formal verification tool (i.e., a software verification tool that may not be tailored for use with automotive software code), such as IBM® Software Formal Verification tool (IBM and all IBM-based trademarks and logos are trademarks or registered trademarks of International Business Machines Corporation and/or its affiliates). Each runnable-entity (RE) receives inputs as arguments and also includes calls to the RTE to provide values of entities from other software components possibly residing in other ECUs. The AUTOSAR model specifies, for each RE, the condition under which the RE should be invoked by the RTE. Example conditions include: the RE being invoked by another RE; the RE being invoked when some data arrives on an input port; the RE being invoked repeatedly in specified time cycles.

Formal verification tools may need an environment that describes the legal behavior of input variables for testing the verification target software component. Normally, the input variables may be assigned non-deterministic values and then the values may be restricted based on built-in constructs (e.g., assumptions) to the legal behaviors. Sometimes, when the legal input space may be too large for a formal proof engine to handle, the legal behaviors may be further restricted to some of the more important test cases. In the present embodiment, formal environments may be automatically generated using a design model (e.g., the AUTOSAR model) and may additionally include a business logic rules model. By providing a generic verification tool with automatically derived assumptions for inputs from the design model (e.g., AUTOSAR design model), the generic formal verification tool may limit tests of the software code to proper test input ranges needed for accurate software component verification. The desired test input may be provided, for example, as additional software code delineating the correct input (e.g., positive integers).

First, a verification person may define some rules constraining entities of the model. For example, the revolutions per minute (RPM) of a vehicle's engine may be constrained to some interesting domain (e.g., within the maximum operating speed of the engine, such as 7,000 RPM) or a temperature signal may be constrained to within a feasible interval (e.g., 0 degrees to 350 degrees Fahrenheit). The verification person may then request the formal verification of some software component of a RE by providing the RE, the design model (e.g., AUTOSAR model) and, optionally, a set of business logic rules.

The present embodiment may then preprocesses the code of the software under test (i.e., the software component or RE) to later pass to a known formal verification tool for software, such as IBM® Software Formal Verification tool. Preprocessing may begin by wrapping the code to be verified in a program (i.e., a wrapper program) that feeds the wrapped code with non-deterministic input values based on the design model and the business logic rules. Assumptions regarding the input values may be defined based on the design model's information. For example, the design model may contain a physical range of variables. The physical range of variables may represent a real-life domain (or a subset of the domain) that a variable may possibly reach (e.g., an intake air temperature sensor may read 120 degrees Fahrenheit, yet 1200 degrees Fahrenheit may not fall within the real-life domain of values) in order to avoid finding faults that may not occur in actual deployment (and potentially wasting resources finding unreachable faults). Business logic rules may be employed to further refine the potential variables used to test the RE, when the constraints may originate from application logic or from verification needs. In the first case, rules may assist in avoiding faults that actually cannot occur (i.e., false positives) by providing application-specific behavior of inputs. In the second case, rules can either help the verification process and reduce the state space of the verification problem or provide limitations based on the current interests of the verification process. The latter can be used in scenarios involving an incomplete model, for example.

Finally, the code under test, together with the automatically generated wrapper and the assumptions defined on the inputs may be verified using a formal verification tool, such as IBM® Software Formal Verification tool.

The verification target may include software from a complete application to a single runnable entity. One use of the present embodiment, may, for example, be compositional verification of a software component where each RE, accompanied by applicable input assumptions and guarantees on output, may be verified, then move on to verifying other REs that use the previously verified REs. In such a case, the call to an already verified RE may be preceded by a guarantee on the inputs and followed by assumptions on the outputs. The wrapper added to the set of REs may invoke the REs based on the invocation specification in the AUTOSAR model (e.g., cyclically or based on port data arrival).

Referring to FIG. 1, an exemplary networked computer environment 100 in accordance with one embodiment is depicted. The networked computer environment 100 may include a computer 102 with a processor 104 and a data storage device 106 that is enabled to run a software program 108 and a vehicular software verification program 110a. The networked computer environment 100 may also include a server 112 that is enabled to run a vehicular software verification program 110b that may interact with a database 114 and a communication network 116. The networked computer environment 100 may include a plurality of computers 102 and servers 112, only one of which is shown. The communication network may include various types of communication networks, such as a wide area network (WAN), local area network (LAN), a telecommunication network, a wireless network, a public switched network and/or a satellite network. It should be appreciated that FIG. 1 provides only an illustration of one implementation and does not imply any limitations with regard to the environments in which different embodiments may be implemented. Many modifications to the depicted environments may be made based on design and implementation requirements.

The client computer 102 may communicate with the server computer 112 via the communications network 116. The communications network 116 may include connections, such as wire, wireless communication links, or fiber optic cables. As will be discussed with reference to FIG. 4, server computer 112 may include internal components 902a and external components 904a, respectively, and client computer 102 may include internal components 902b and external components 904b, respectively. Server computer 112 may also operate in a cloud computing service model, such as Software as a Service (SaaS), Platform as a Service (PaaS), or Infrastructure as a Service (IaaS). Server 112 may also be located in a cloud computing deployment model, such as a private cloud, community cloud, public cloud, or hybrid cloud. Client computer 102 may be, for example, a mobile device, a telephone, a personal digital assistant, a netbook, a laptop computer, a tablet computer, a desktop computer, or any type of computing devices capable of running a program, accessing a network, and accessing a database 114. According to various implementations of the present embodiment, the vehicular software verification program 110a, 110b may interact with a database 114 that may be embedded in various storage devices, such as, but not limited to a computer/mobile device 102, a networked server 112, or a cloud storage service.

According to the present embodiment, a user using a client computer 102 or a server computer 112 may use the vehicular software verification program 110a, 110b (respectively) to formally verify software components for vehicular software systems before the software components may be embedded in vehicle computer hardware. The vehicular software verification method is explained in more detail below with respect to FIGS. 2 and 3.

Figure 2:
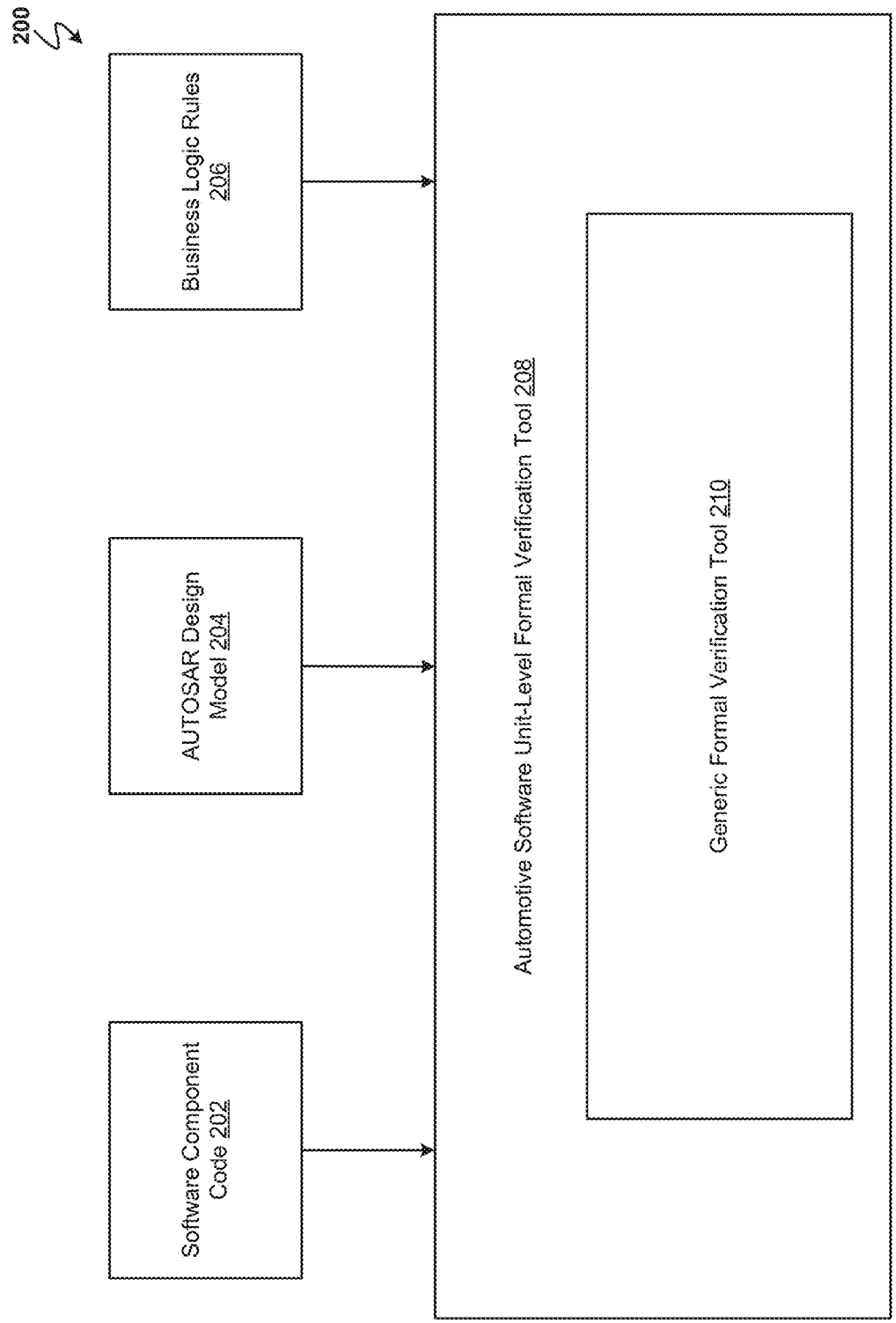
FIG. 2 is a system flow diagram of the vehicular software verification program according to at least one embodiment.

Referring now to FIG. 2, a system flow diagram of the vehicular software verification system 200 according to at least one embodiment is depicted.

As described previously, a user provides as input software component code 202, a design model, such as the AUTOSAR design model 204, and business logic rules 206 for use by an automotive software unit-level formal verification tool 208. The automotive software unit-level formal verification tool 208 may use the steps that will be discussed in detail below with reference to FIG. 3 to utilize the software component code 202, AUTOSAR design model 204, and business logic rules 206 to create wrapped code and define input behavior that may be passed to a known generic formal verification tool 210 (e.g., IBM® Software Formal Verification tool).

The software component code 202 provided to the automotive software unit-level formal verification tool 208 may be, for example, a complete application, a software component, or a single runnable entity (RE) that may be the verification target. For example, the software component code 202 may be code for handling engine knock sensors using engine coolant temperature inputs to determine when the knock sensor's readings will be read, filtering knock sensor input readings to remove irrelevant frequencies that may not be related to engine knock, and output ignition timing changes based on determined engine knocking.

The automotive software unit-level formal verification tool 208 may also be supplied with a design model, such as the AUTOSAR design model 204. The design model (e.g., AUTOSAR) provides a standardized automotive software architecture that defines standardized interfaces used by software components or REs. Therefore, the interfaces defined by the design model may be used to create a program wrapper for the software component code 202 to ensure any desired input variables or outputs are consistent with the standards set by the design model (e.g., AUTOSAR design model 204) as will be discussed in detail below with reference to FIG. 3.

Additionally, known business logic rules 206 may be provided to the automotive software unit-level formal verification tool 208 that may define specific verification needs or application logic that should also be taken into account when verification occurs.

Figure 3:
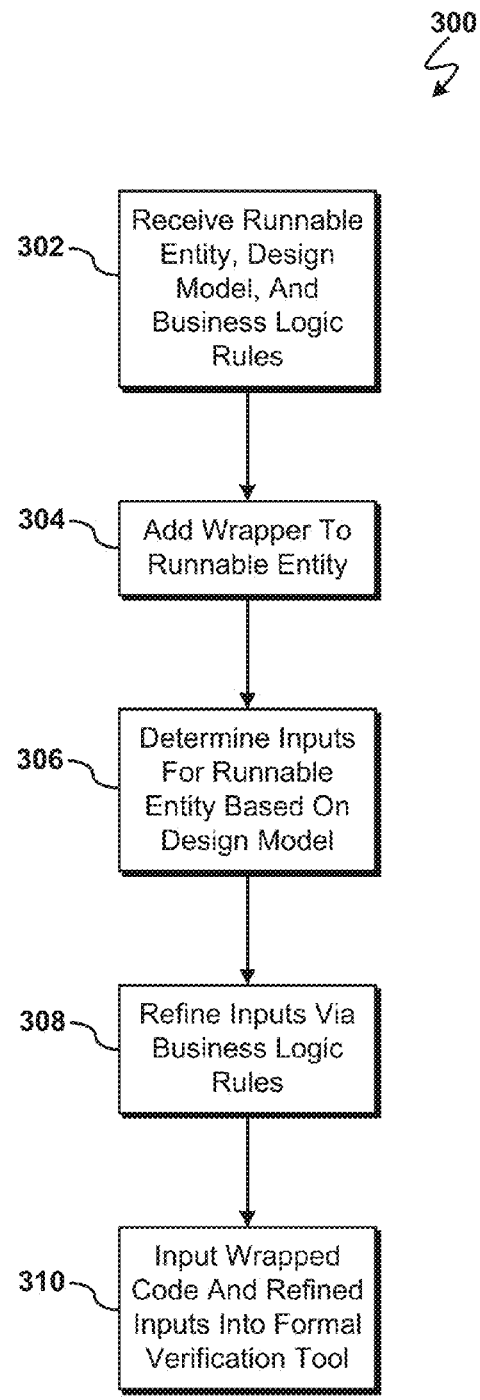
FIG. 3 is an operational flow chart illustrating a process for verifying vehicular software according to at least one embodiment.

Referring now to FIG. 3, an operational flow chart illustrating the exemplary vehicular software verification process 300 used by the vehicular software verification program 110a and 110b (FIG. 1) according to at least one embodiment is depicted.

At 302, the vehicular software verification process 300 receives a runnable entity (i.e., software component code 202 (FIG. 2)), a design model (e.g., AUTOSAR design model 204 (FIG. 2)), and business logic rules 206 (FIG. 2). According to at least one embodiment, a verification person (i.e., user) may provide the runnable entity, design model, and business logic rules for the vehicular software verification process 300. For example, the verification person may supply C source code for the runnable entity, the AUTOSAR model as the design model, and a set of known business logic rules.

Next, at 304, a wrapper program (i.e., formal verification environment) is automatically generated and added to the runnable entity (RE). According to at least one embodiment, the wrapper program is automatically generated based on the design model (e.g., AUTOSAR) provided at 302. The interfaces and architecture described by the design model are used to automatically generate the RE wrapper. The wrapper, using the design model, provides for inputs to be passed to the wrapped RE in a form consistent with the design model's architecture. Information about the correct inputs the software component code 202 (FIG. 2) may be tested with, may be determined from the design model automatically.

For example, if a RE is wrapped using an AUTOSAR-based wrapper, the wrapper may convert any inputs into a format that is consistent with the AUTOSAR design model 204 (FIG. 2). The provided model (i.e., AUTOSAR model) may be searched for software code that indicates how the RE expects to receive inputs and describes how the verification target RE should handle a given input.

Therefore, the RE may be tested by a generic formal verification tool 210 (FIG. 2) consistently with the AUTOSAR design model 204 (FIG. 2) by ensuring inputs are given to the RE as they would in an AUTOSAR environment and the generic formal verification tool 210 (FIG. 2) may understand how the RE should handle the inputs sent to the RE. The wrapper may also be generated to format real-time environment (RTE) calls used with the RE to be consistent with the provided design model.

Then, at 306, inputs for the wrapped RE are determined based on the design model. According to at least one embodiment, the format of data sent to the RE as input may be dictated by the design model. As described previously, the input behavior of the RE may be described by the input design model. Thus, the design model may be searched automatically, for example, for code that indicates the proper input behavior for the inputs the RE may expect.

For example, the AUTOSAR design model 204 (FIG. 2) may have a piece of code indicating that engine coolant temperature data has a physical range of −40 degrees Celsius to 120 degrees Celsius. Thus, the range of possible input engine coolant temperatures that may be used to verify the RE may be restricted to between −40 degrees Celsius to 120 degrees Celsius.

At 308, the inputs for the wrapped RE determined at 306 are refined via the business logic rules 206 (FIG. 2) provided at 302. According to at least one embodiment, business logic rules may be employed to further refine the potential variables used to test the RE, when the constraints may originate from application logic or from verification needs. In the first case, rules may assist in avoiding faults that actually cannot occur (i.e., false positives) by providing application-specific behavior of inputs. In the second case, rules can either help the verification process and reduce the state space of the verification problem or provide limitations based on the current interests of the verification process. The latter can be used in scenarios involving an incomplete model, for example.

Next, at 310 the wrapped code (i.e., RE and associated automatically generated formal verification environment) and the inputs refined at 308 are sent as input to a generic formal verification tool. According to at least one embodiment, the RE and associated wrapper may be sent to a known generic formal verification tool 210 (FIG. 2) as the verification target. Additionally, the inputs, determined and refined previously, to be used by the generic formal verification tool 210 (FIG. 2) to verify the verification target may be sent to the generic formal verification tool 210 (FIG. 2). Having the RE wrapped with a wrapper program based on the design model may allow the generic formal verification tool 210 (FIG. 2) to test the RE without having to account for the design model the RE may be designed to run in since the wrapper may convert the inputs generated by the generic formal verification tool 210 (FIG. 2) into the form the RE is designed to handle. Using the inputs refined at 308 may provide the generic formal verification tool 210 (FIG. 2) with test inputs from a relevant range.

For example, a RE for altering fuel injector duty cycles based on engine coolant temperature may be wrapped in a wrapper program based on the AUTOSAR design model 204 (FIG. 2). The engine coolant temperature sensor input range may be defined by the AUTOSAR design model 204 (FIG. 2) to −40 degrees to 120 degrees Celsius. The inputs may be further refined by business logic rules 206 (FIG. 2) to a range of −40 degrees to 0 degrees Celsius in order to test fuel enrichment during cold engine starts. Thus, the wrapped RE and the engine coolant temperature range of −40 degrees to 0 degrees Celsius may be sent as inputs to the generic formal verification tool 210 (FIG. 2), such as IBM® Software Formal Verification tool for formal verification of the RE.

It may be appreciated that FIGS. 2 and 3 provide only an illustration of one embodiment and does not imply any limitations with regard to how different embodiments may be implemented. Many modifications to the depicted embodiment(s) may be made based on design and implementation requirements.

Figure 4:
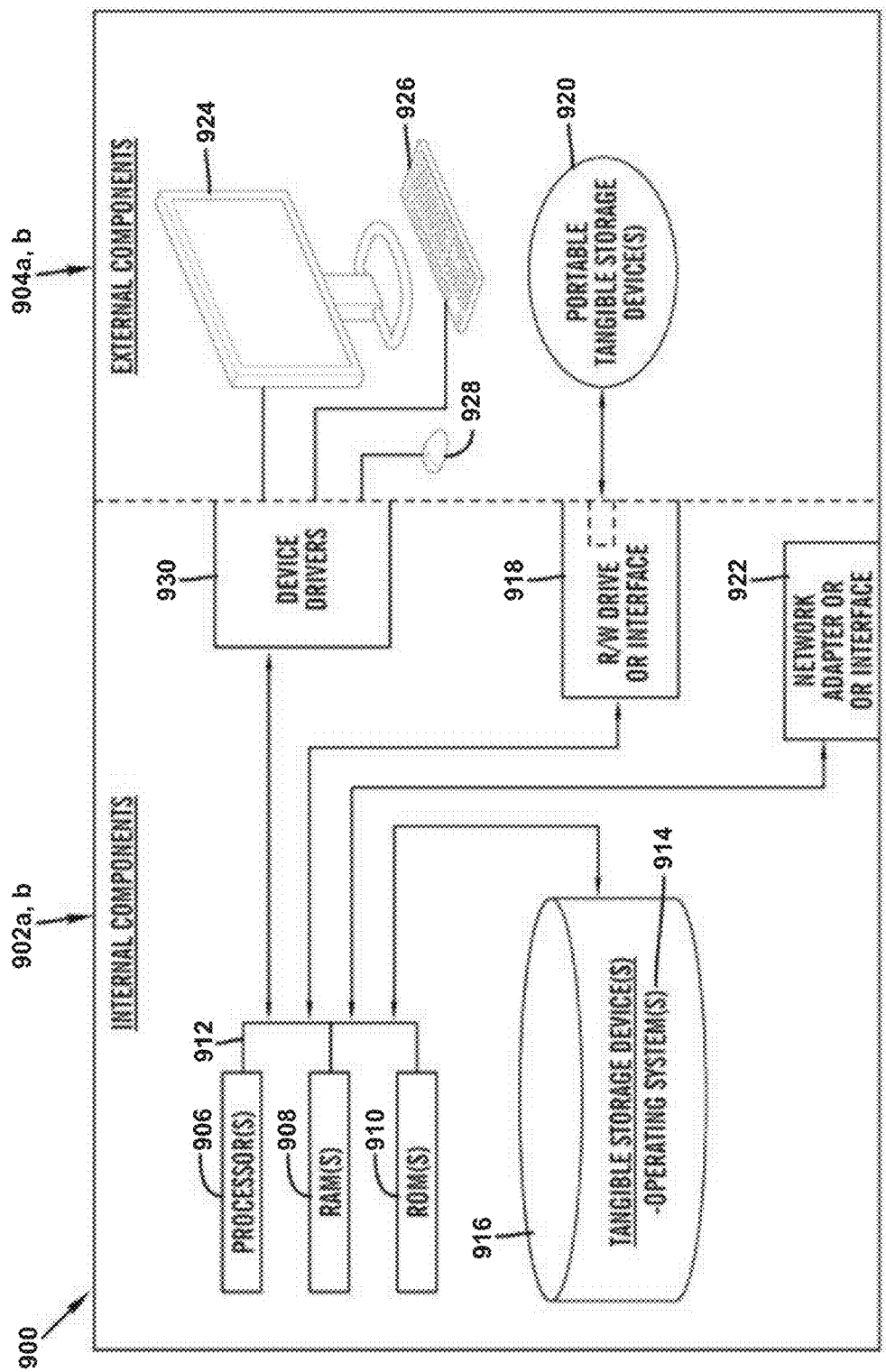
FIG. 4 is a block diagram of internal and external components of computers and servers depicted in FIG. 1 according to at least one embodiment.

FIG. 4 is a block diagram 900 of internal and external components of computers depicted in FIG. 1 in accordance with an illustrative embodiment of the present invention. It should be appreciated that FIG. 4 provides only an illustration of one implementation and does not imply any limitations with regard to the environments in which different embodiments may be implemented. Many modifications to the depicted environments may be made based on design and implementation requirements.

Data processing system 902, 904 is representative of any electronic device capable of executing machine-readable program instructions. Data processing system 902, 904 may be representative of a smart phone, a computer system, PDA, or other electronic devices. Examples of computing systems, environments, and/or configurations that may be represented by data processing system 902, 904 include, but are not limited to, personal computer systems, server computer systems, thin clients, thick clients, hand-held or laptop devices, multiprocessor systems, microprocessor-based systems, network PCs, minicomputer systems, and distributed cloud computing environments that include any of the above systems or devices.

User client computer 102 (FIG. 1), and network server 112 (FIG. 1) may include respective sets of internal components 902 *a, b* and external components 904 *a, b* illustrated in FIG. 4. Each of the sets of internal components 902 *a, b* includes one or more processors 906, one or more computer-readable RAMs 908 and one or more computer-readable ROMs 910 on one or more buses 912, and one or more operating systems 914 and one or more computer-readable tangible storage devices 916. The one or more operating systems 914 and the software program 108 (FIG. 1) and the vehicular software verification program 110*a* (FIG. 1) in client computer 102 (FIG. 1) and the vehicular software verification program 110b (FIG. 1) in network server 112 (FIG. 1), may be stored on one or more computer-readable tangible storage devices 916 for execution by one or more processors 906 via one or more RAMs 908 (which typically include cache memory). In the embodiment illustrated in FIG. 4, each of the computer-readable tangible storage devices 916 is a magnetic disk storage device of an internal hard drive. Alternatively, each of the computer-readable tangible storage devices 916 is a semiconductor storage device such as ROM 910, EPROM, flash memory or any other computer-readable tangible storage device that can store a computer program and digital information.

Each set of internal components 902 a, b also includes a R/W drive or interface 918 to read from and write to one or more portable computer-readable tangible storage devices 920 such as a CD-ROM, DVD, memory stick, magnetic tape, magnetic disk, optical disk or semiconductor storage device. A software program, such as the software program 108 (FIG. 1) and the vehicular software verification program 110a and 110b (FIG. 1) can be stored on one or more of the respective portable computer-readable tangible storage devices 920, read via the respective R/W drive or interface 918 and loaded into the respective hard drive 916.

Each set of internal components 902 a, b may also include network adapters (or switch port cards) or interfaces 922 such as a TCP/IP adapter cards, wireless wi-fi interface cards, or 3G or 4G wireless interface cards or other wired or wireless communication links. The software program 108 (FIG. 1) and the vehicular software verification program 110a (FIG. 1) in client computer 102 (FIG. 1) and the vehicular software verification program 110b (FIG. 1) in network server computer 112 (FIG. 1) can be downloaded from an external computer (e.g., server) via a network (for example, the Internet, a local area network or other, wide area network) and respective network adapters or interfaces 922. From the network adapters (or switch port adaptors) or interfaces 922, the software program 108 (FIG. 1) and the vehicular software verification program 110a (FIG. 1) in client computer 102 (FIG. 1) and the vehicular software verification program 110b (FIG. 1) in network server computer 112 (FIG. 1) are loaded into the respective hard drive 916. The network may comprise copper wires, optical fibers, wireless transmission, routers, firewalls, switches, gateway computers and/or edge servers.

Each of the sets of external components 904 a, b can include a computer display monitor 924, a keyboard 926, and a computer mouse 928. External components 904 a, b can also include touch screens, virtual keyboards, touch pads, pointing devices, and other human interface devices. Each of the sets of internal components 902 a, b also includes device drivers 930 to interface to computer display monitor 924, keyboard 926 and computer mouse 928. The device drivers 930, R/W drive or interface 918 and network adapter or interface 922 comprise hardware and software (stored in storage device 916 and/or ROM 910).

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

Figure 5:
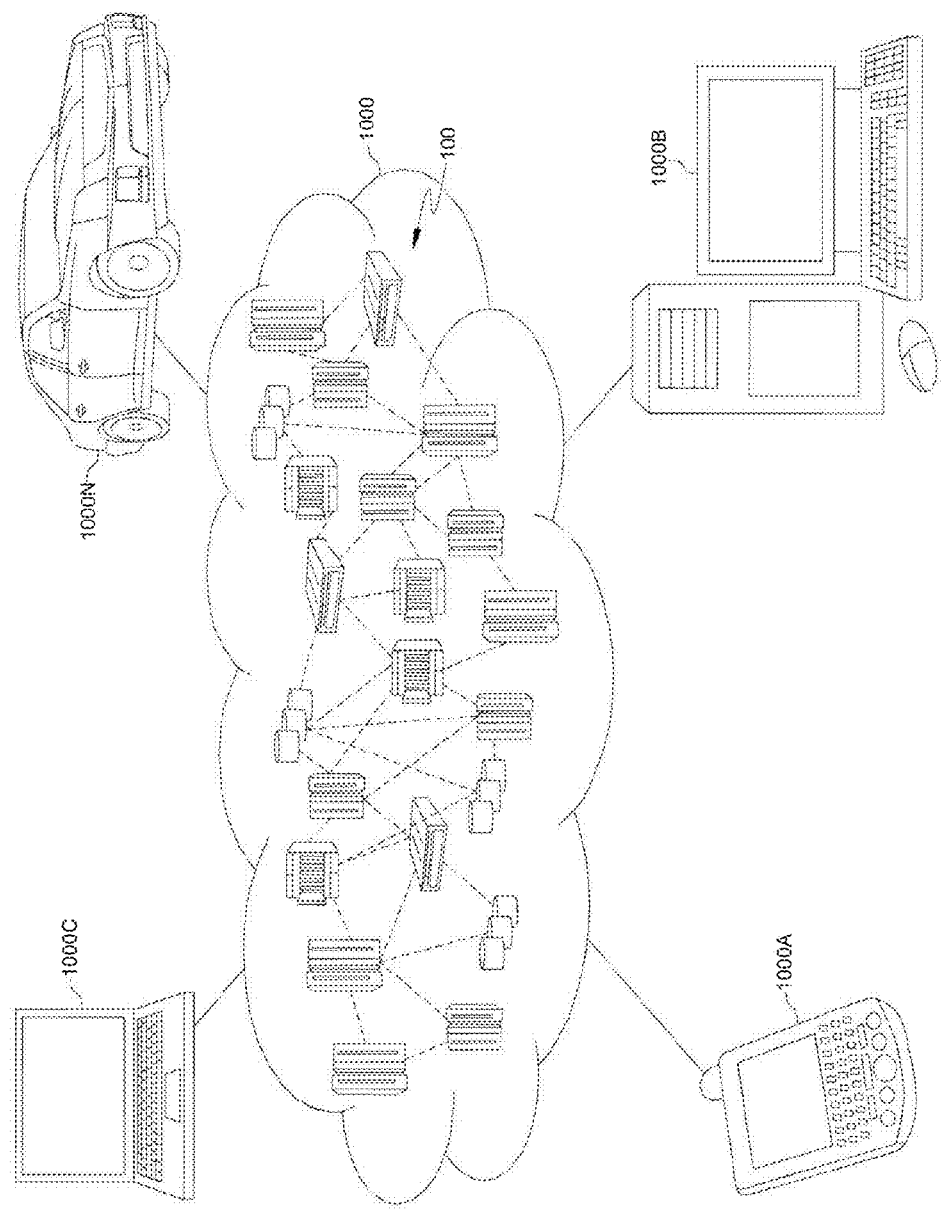
FIG. 5 is a block diagram of an illustrative cloud computing environment including the computer system depicted in FIG. 1, in accordance with an embodiment of the present disclosure.

Referring now to FIG. 5, illustrative cloud computing environment 1000 is depicted. As shown, cloud computing environment 1000 comprises one or more cloud computing nodes 100 with which local computing devices used by cloud consumers, such as, for example, personal digital assistant (PDA) or cellular telephone 1000A, desktop computer 1000B, laptop computer 1000C, and/or automobile computer system 1000N may communicate. Nodes 100 may communicate with one another. They may be grouped (not shown) physically or virtually, in one or more networks, such as Private, Community, Public, or Hybrid clouds as described hereinabove, or a combination thereof. This allows cloud computing environment 1000 to offer infrastructure, platforms and/or software as services for which a cloud consumer does not need to maintain resources on a local computing device. It is understood that the types of computing devices 1000A-N shown in FIG. 5 are intended to be illustrative only and that computing nodes 100 and cloud computing environment 1000 can communicate with any type of computerized device over any type of network and/or network addressable connection (e.g., using a web browser).

Figure 6:
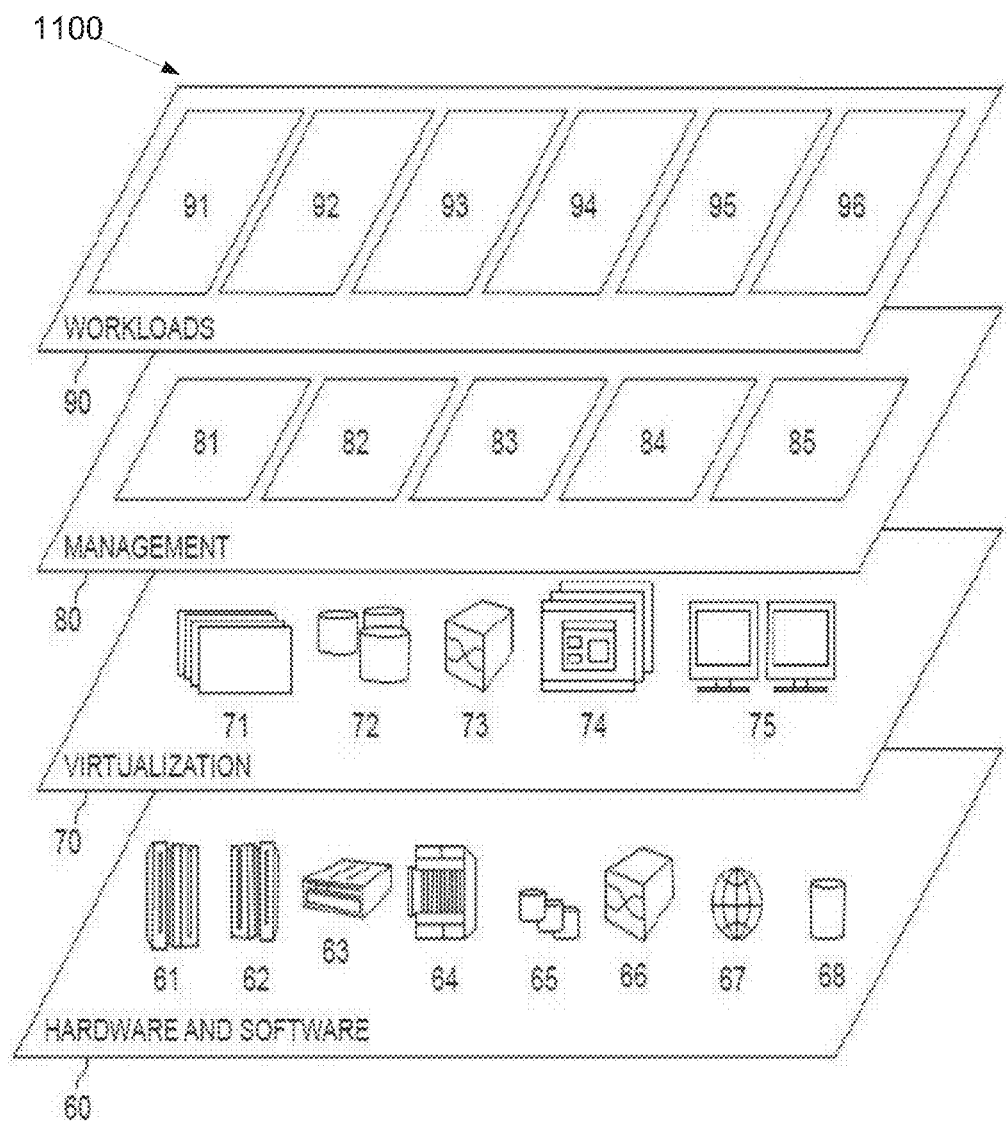
FIG. 6 is a block diagram of functional layers of the illustrative cloud computing environment of FIG. 5, in accordance with an embodiment of the present disclosure.

Referring now to FIG. 6, a set of functional abstraction layers 1100 provided by cloud computing environment 1000 (FIG. 5) is shown. It should be understood in advance that the components, layers, and functions shown in FIG. 6 are intended to be illustrative only and embodiments of the invention are not limited thereto. As depicted, the following layers and corresponding functions are provided:

Hardware and software layer 60 includes hardware and software components. Examples of hardware components include: mainframes 61; RISC (Reduced Instruction Set Computer) architecture based servers 62; servers 63; blade servers 64; storage devices 65; and networks and networking components 66. In some embodiments, software components include network application server software 67 and database software 68.

Virtualization layer 70 provides an abstraction layer from which the following examples of virtual entities may be provided: virtual servers 71; virtual storage 72; virtual networks 73, including virtual private networks; virtual applications and operating systems 74; and virtual clients 75.

In one example, management layer 80 may provide the functions described below. Resource provisioning 81 provides dynamic procurement of computing resources and other resources that are utilized to perform tasks within the cloud computing environment. Metering and Pricing 82 provide cost tracking as resources are utilized within the cloud computing environment, and billing or invoicing for consumption of these resources. In one example, these resources may comprise application software licenses. Security provides identity verification for cloud consumers and tasks, as well as protection for data and other resources. User portal 83 provides access to the cloud computing environment for consumers and system administrators. Service level management 84 provides cloud computing resource allocation and management such that required service levels are met. Service Level Agreement (SLA) planning and fulfillment 85 provide pre-arrangement for, and procurement of, cloud computing resources for which a future requirement is anticipated in accordance with an SLA.

Workloads layer 90 provides examples of functionality for which the cloud computing environment may be utilized. Examples of workloads and functions which may be provided from this layer include: mapping and navigation 91; software development and lifecycle management 92; virtual classroom education delivery 93; data analytics processing 94; transaction processing 95; and vehicular software verification 96. A vehicular software verification program 110a, 110b (FIG. 1) provides a way to automatically generate a formal environment allowing a known generic formal verification tool to be applied to the verification target software components.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for preparing a software component for verification, the method comprising:

receiving the software component, a set of business logic rules, and an automotive open system architecture (AUTOSAR) design model, wherein the received software component includes one of an application and a runnable entity, and wherein the received set of business logic rules includes constraints originating from (i) application logic including application-specific behavior of inputs and (ii) verification needs including limitations based on current verification interests;

generating a wrapper program based on the received software component and the received AUTOSAR design model, wherein the wrapper program includes automatically generated code that formats inputs and real-time environment (RTE) calls passed to the received software component to conform to interfaces and an architecture described by the received AUTOSAR design model;

combining the generated wrapper program with the received software component into a wrapped software component;

determining a plurality of inputs for the wrapped software component based on searching the received AUTOSAR design model for a code portion indicating proper input behavior;

filtering the determined plurality of inputs for the wrapped software component based on the received set of business logic rules;

sending the filtered plurality of inputs for the wrapped software component and the wrapped software component to a verification tool; and verifying the sent wrapped software component using the verification tool based on inputting the sent filtered plurality of inputs for the wrapped software component into the sent wrapped software component and analyzing an output.

\* \* \* \* \*